United States Patent
Brandmeier et al.

(10) Patent No.: US 10,300,790 B2
(45) Date of Patent: May 28, 2019

(54) POWER TRANSMISSION SYSTEM AND METHOD FOR OPERATING A POWER TRANSMISSION SYSTEM

(71) Applicant: SIEMENS MOBILITY GMBH, Munich (DE)

(72) Inventors: Marco Brandmeier, Moehrendorf (DE); Stefan Di Bonaventura, Buechenbach (DE); Markus Herzog, Fuerth (DE)

(73) Assignee: Siemens Mobility GmbH, Munich (DE)

( * ) Notice: Subject to any disclaimer, the term of this patent is extended or adjusted under 35 U.S.C. 154(b) by 0 days.

(21) Appl. No.: 15/504,784

(22) PCT Filed: Sep. 15, 2015

(86) PCT No.: PCT/EP2015/071054
§ 371 (c)(1),
(2) Date: Feb. 17, 2017

(87) PCT Pub. No.: WO2016/041939
PCT Pub. Date: Mar. 24, 2016

(65) Prior Publication Data
US 2018/0147940 A1    May 31, 2018

(30) Foreign Application Priority Data
Sep. 18, 2014   (DE) .................. 10 2014 218 764

(51) Int. Cl.
*G01R 33/36*    (2006.01)
*B60L 3/00*    (2019.01)
(Continued)

(52) U.S. Cl.
CPC ............... *B60L 3/0069* (2013.01); *B60L 3/04* (2013.01); *B60L 3/12* (2013.01); *B60L 9/00* (2013.01);
(Continued)

(58) Field of Classification Search
CPC .............. G01R 33/5608; G01R 33/543; G01R 31/025; G01R 33/36
(Continued)

(56) References Cited

U.S. PATENT DOCUMENTS

2003/0107381 A1* 6/2003 Wang .................... H02H 3/283
324/522
2009/0267611 A1* 10/2009 Wahlroos ............. G01R 31/088
324/522

(Continued)

FOREIGN PATENT DOCUMENTS

CH          126004 A    7/1928
CN      101916986 A   12/2010
(Continued)

*Primary Examiner* — Patrick Assouad
*Assistant Examiner* — Taqi R Nasir
(74) *Attorney, Agent, or Firm* — Laurence Greenberg; Werner Stemer; Ralph Locher

(57) ABSTRACT

A power transmission system facilitates the location of an insulation fault in the power transmission system by providing a power transmission network, an insulation fault locating unit and a connecting line system which is electrically connected to the insulation fault locating unit and to the power transmission network. The connecting line system includes a switch constructed to interrupt and re-establish an electrical connection between the power transmission network and the insulation fault locating unit. A vehicle, in particular a rail vehicle, including a power transmission system and a method for operating a power transmission system, are also provided.

15 Claims, 1 Drawing Sheet

(51) Int. Cl.
  *B60L 3/04* (2006.01)
  *B60L 3/12* (2006.01)
  *B60L 9/00* (2019.01)
  *G01R 27/18* (2006.01)
  *G01R 31/02* (2006.01)
  *G01R 31/00* (2006.01)

(52) U.S. Cl.
  CPC ........... *B60L 2200/26* (2013.01); *G01R 27/18* (2013.01); *G01R 31/008* (2013.01); *G01R 31/025* (2013.01)

(58) Field of Classification Search
  USPC ........... 324/761.01, 521, 522, 523, 527, 511, 324/503, 322, 526, 537, 750.3, 757.02, 324/763.01, 75, 7.02
  See application file for complete search history.

(56) References Cited

U.S. PATENT DOCUMENTS

| | | | | |
|---|---|---|---|---|
| 2010/0254056 A1* | 10/2010 | Narendra | ........... | H02H 3/265 361/87 |
| 2010/0277181 A1* | 11/2010 | Saha | ........... | G01R 31/088 324/521 |
| 2011/0057661 A1* | 3/2011 | Samineni | ........... | H02H 7/16 324/521 |
| 2012/0086459 A1* | 4/2012 | Kim | ........... | G01R 29/18 324/522 |
| 2012/0186309 A1* | 7/2012 | Ishida | ........... | B60L 11/123 70/57 |
| 2012/0223734 A1* | 9/2012 | Takada | ........... | H02S 50/10 324/761.01 |
| 2013/0193907 A1* | 8/2013 | Thomas | ........... | B60L 3/0069 320/107 |
| 2013/0300430 A1* | 11/2013 | Lindsay | ........... | B60L 3/0046 324/522 |
| 2014/0118000 A1* | 5/2014 | Pan | ........... | G01R 31/08 324/537 |
| 2014/0232415 A1* | 8/2014 | Ohtomo | ........... | H02H 7/261 324/537 |
| 2015/0240529 A1* | 8/2015 | Dore Vasudevan | ........... | E05B 47/0012 70/277 |

FOREIGN PATENT DOCUMENTS

| | | |
|---|---|---|
| CN | 103033722 A | 4/2013 |
| CN | 103278725 A | 9/2013 |
| CN | 203444052 U | 2/2014 |
| CN | 103995214 A | 8/2014 |
| DE | 4125446 A1 | 2/1993 |
| RU | 23685 U1 | 6/2002 |
| RU | 2386943 C1 | 4/2010 |
| SU | 1445993 A | 12/1988 |

* cited by examiner

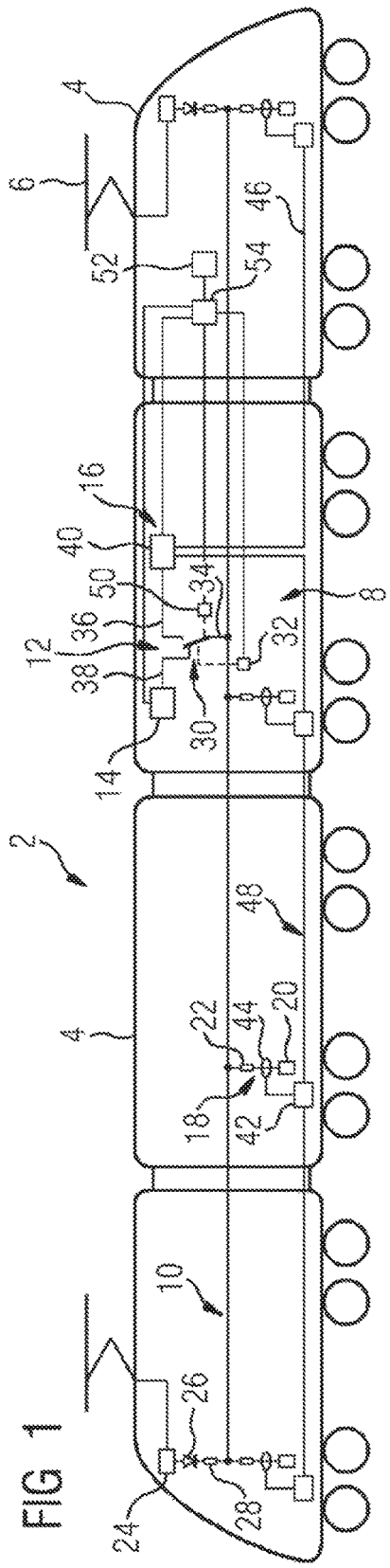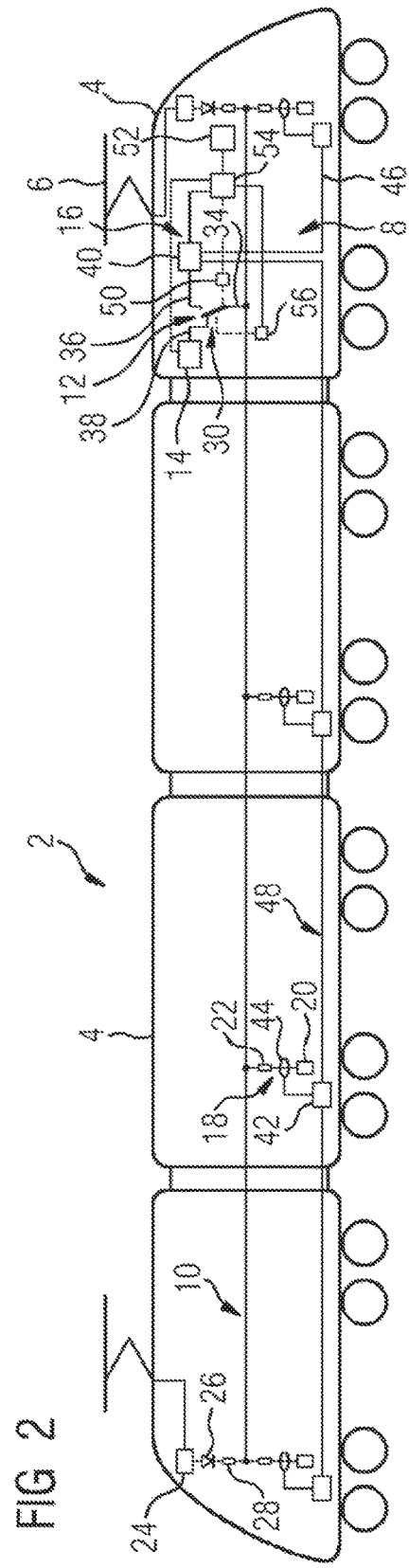

POWER TRANSMISSION SYSTEM AND METHOD FOR OPERATING A POWER TRANSMISSION SYSTEM

BACKGROUND OF THE INVENTION

Field of the Invention

The invention relates to a power transmission system. There are numerous technical fields in which it is safety-critical if a power transmission system of an installation has an insulation fault, as the insulation fault may cause a power supply failure, for example.

In these technical fields it is known to use an insulation fault detection unit to determine whether a power transmission system of an installation has an insulation fault. Although such an insulation fault detection unit enables an insulation fault present to be detected even during ongoing operation of an installation, the insulation fault detection unit provides no means of locating the insulation fault. However, locating an insulation fault is necessary in order to be able to repair the insulation fault promptly.

SUMMARY OF THE INVENTION

The object of the invention is to specify a power transmission system in which insulation fault location can be implemented with low cost/complexity.

This object is achieved according to the invention by a power transmission system comprising a power transmission network, an insulation fault locating unit and a connecting line system which is electrically connected to the insulation fault locating unit and to the power transmission network and which comprises a switch which is designed to break and re-establish an electrical connection between the power transmission network and the insulation fault locating unit.

The invention is based on the consideration that an insulation fault in the power transmission system can be located using an insulation fault locating unit. An insulation fault locating unit can be conceived of as a device or system of devices designed to locate the part or section of the power transmission system in which an insulation fault is present.

A problem with using such an insulation fault locating unit is that signals and/or relays may be unintentionally affected by a test current which the insulation fault locating unit generates and passes through the power transmission network for the purpose of fault location.

There are installations in which unintentional influencing of signals and/or relays can be safety-critical, particularly during operation of such an installation. Such installations include vehicles.

The switch makes it possible to disconnect the insulation fault locating unit electrically from the power transmission network, thereby preventing the insulation fault locating unit from passing a test current through the power transmission network during a safety critical state of the installation. The switch also enables the insulation fault locating unit to be electrically connected to the power transmission network e.g. only if an insulation fault was previously found by a insulation fault detection unit, so that the insulation fault locating unit can pass a test current through the power transmission network.

In addition, the insulation fault locating unit can inventively be a permanently installed, i.e. fixed, component of the power transmission system. This eliminates the complex/costly mounting and/or dismounting of the insulation fault locating unit or rather of its components, as is necessary whenever a mobile insulation fault locating unit is used.

Moreover, the insulation fault locating unit can be inventively designed such that a plurality of lines of the power transmission network can be automatically checked for an insulation fault. For this purpose a measuring instrument can be provided for each of said plurality of lines of the power transmission network. This obviates the need to check all the electrical lines of the power transmission system individually for an insulation fault using a mobile measuring instrument.

The power transmission system can comprise a terminal for connecting a power source, in particular a DC power source. Alternatively or additionally, a power source can be a constituent part of the power transmission system.

A power transmission network can here be understood as meaning a line system for transmitting electric current to a least one electrical load.

The connecting line system can comprise one or more connecting lines. Such a connecting line of the connecting line system can be designed to electrically connect an element of the power transmission system to the power transmission network and/or to another element.

An insulation fault may be present, for example, if an insulation resistance between an electrical conductor of the power transmission system and another electrical conductor of the power transmission system falls below a predefined resistance value or more precisely an insulation resistance of an electrical conductor of the power transmission system falls below a predefined resistance value with respect to ground potential.

The insulation fault can be in particular a ground fault. A ground fault can be understood as meaning an unintentional electrically conductive or low-resistance connection between an electrical conductor of the current monitoring system and a grounded element.

The switch advantageously has a position in which the insulation fault locating unit is electrically disconnected from the power transmission network. The switch also advantageously has a position in which the insulation fault locating unit is electrically connected to the power transmission network.

The power transmission system can have an insulation fault detection unit. An insulation fault detection unit can be conceived of as a device or system of devices designed to determine whether the power transmission system has an insulation fault.

To this end, the insulation fault detection unit can be used to initially determine whether the power transmission system has an insulation fault. The insulation fault detection unit can be used for this purpose particularly during ongoing operation of the power transmission system or of an apparatus of which the power transmission system is a constituent part. The insulation fault locating unit can then be employed to locate an insulation fault found with the aid of the insulation fault detection unit.

In addition, the insulation fault detection unit can be electrically connected to the connecting line system. The switch is advantageously designed to break and re-establish an electrical connection between the power transmission network and the insulation fault detection unit.

The switch can therefore have a position in which the insulation fault detection unit is electrically disconnected from the power transmission network. In addition, the switch can have a position in which the insulation fault detection unit is electrically connected to the power transmission network.

The switch can provide a simple and/or safe means of switching between an operating mode of the power transmission system for locating an insulation fault and an operating mode of the power transmission system for identifying/detecting an insulation fault. The identification/detection mode is non-critical from a safety point of view. The insulation fault location mode, on the other hand, may be safety-critical.

The power transmission system can also have another switch which, in addition to or instead of the first mentioned switch, is designed to break and re-establish an electrical connection between the power transmission network and the insulation fault detection unit. In addition, a switch position of the other switch can be linked to a switch position of the first mentioned switch.

The connecting line system preferably comprises a first connecting line by which the switch is electrically connected to the power transmission network. In addition, it is advantageous for the connecting line system to comprise a second connecting line by which the switch is electrically connected to the insulation fault locating unit. It is also advantageous for the connecting line system to comprise a third connecting line by which the switch is electrically connected to the insulation fault detection unit.

In an advantageous embodiment of the invention, the switch is a changeover switch, in particular a single-pole, double-throw switch. The changeover switch can be designed to break the electrical connection between the power transmission network and the insulation fault locating unit and, in doing so, establish an electrical connection between the power transmission network and the insulation fault detection unit. Moreover, the changeover switch can be designed to establish an electrical connection between the power transmission network and the insulation fault locating unit and, in doing so, break an electrical connection between the power transmission network and the insulation fault detection unit.

In addition, the switch can be implemented as a manually operated switch, in particular as a rotary switch, or as a relay.

An advantageous embodiment of the invention provides that the power transmission system comprises a locking device, in particular an electrically controllable locking device. The locking device is advantageously designed to lock the switch. The locking device is preferably designed to lock the switch and unlock it again. Locking of the switch can be conceived of as preventing actuation of the switch, in particular by mechanical means. Unlocking of the switch, on the other hand, can be conceived of as enabling actuation of the switch. Actuation of the switch can in turn be understood as meaning changing over a switch position.

The locking device makes it possible to prevent the switch from being actuated accidentally. In addition, the locking device can also be used to ensure that the switch can only be actuated if a predefined condition is met.

In addition, the power transmission system can have a test device for determining a switch position. The test device can comprise, among other things, a photodiode for determining the switch position.

The power transmission network preferably comprises a plurality of branch circuits. The branch circuits are advantageously designed to transmit electric current to at least one electrical load. For this purpose the branch circuits are each appropriately connected to at least one electrical load.

It is advantageous if the insulation fault locating unit has an evaluation device. This evaluation device can be designed to produce a test current. The evaluation device can also be designed to pass the test current through the power transmission network, in particular through the individual branch circuits. The insulation fault locating unit is preferably designed to determine which of the branch circuits of the power transmission network has an insulation fault, assuming that one of the branch circuits has such an insulation fault.

In addition, it is advantageous if the insulation fault locating unit has a measuring instrument, in particular an ammeter, for each of the branch circuits. It is further advantageous if the insulation fault locating unit has an instrument transformer, in particular a current transformer, for each of the branch circuits. In addition, the instrument transformer can be electrically connected to one of the measuring instruments in each case. Said instrument transformers are each connected to different measuring instruments.

Each of the instrument transformers is preferably connected to one of the branch circuits. Said instrument transformers are advantageously connected to different branch circuits in each case.

In addition, the measuring instruments can be designed to transfer data to the evaluation device. For this purpose a plurality of, in particular all of the measuring instruments can be connected to the evaluation device via a data bus. Moreover, at least one of the measuring instruments can be connected to the evaluation device via a separate data line.

The power transmission system can be, among other things, a constituent part of a vehicle, in particular of a rail vehicle. The power transmission system can be, for example, a constituent part of the vehicle's electrical system.

Here the rail vehicle can be conceived of as an individual tractive unit or as a grouping of a plurality of tractive units. Likewise, a grouping of at least one tractive unit and at least one non-driving car can be conceived of as a rail vehicle.

In addition, the vehicle can comprise a control unit. The insulation fault locating unit can be designed to transfer data to the control unit, e.g. via a data line and/or by radio. The insulation fault detection unit can also be designed to transfer data to the control unit.

In the case that the vehicle is a rail vehicle, the control unit can be in particular a train control unit. A train control unit may be conceived of as a device which is designed, among other things, to generate control commands for a pantograph controller, a drive or braking system, an electrical system controller and/or an auxiliary supply controller. The train control unit can also be used as a diagnostic system.

The invention further relates to a method for operating a power transmission system.

In order to provide low-cost/low-complexity insulation fault location, a method is proposed in which a connecting line system is electrically connected according to the invention to a power transmission network and also to an insulation fault locating unit, and the insulation fault locating unit previously electrically disconnected from the power transmission network by means of a switch of the connecting line system is electrically connected to the power transmission network by means of the switch if a predefined condition is fulfilled.

The method can be used in particular to operate the inventive power transmission system and/or one of its above described further developments.

The insulation fault locating unit is preferably electrically connected to the power transmission network by means of the switch only if a predefined condition is fulfilled. If the predefined condition is not or no longer fulfilled, the insulation fault locating unit is preferably electrically disconnected from the power transmission network by means of the switch.

The predefined condition can include, among other things, a device of which the power transmission system is a constituent part being in a predefined state or the power transmission system itself being in a predefined state. The predefined state can be a state in which it is uncritical from a safety point of view if a test current is passed through the power transmission network.

In addition, the predefined condition can include the power transmission system having an insulation fault, in particular an insulation fault determined by an insulation fault detection unit. The insulation fault can be e.g. a ground fault.

Advantageously, an insulation fault detection unit previously electrically connected to the power transmission network is advantageously disconnected from the power transmission network by means of the switch if the predefined condition is fulfilled. Said insulation fault detection unit can be electrically connected to the connecting line system.

To detect an insulation fault, the insulation fault detection unit advantageously determines/monitors an insulation resistance of the power transmission network, in particular an insulation resistance with respect to ground potential.

A switch position is preferably determined, in particular by means of a test device. In addition, it is preferable for the switch position to be visually and/or audibly output, in particular by means of an output device. This enables a person authorized to actuate the switch manually, or electrically by means of a control unit, to be informed of the switch position in a simple manner.

In addition, a fault indication can be output by means of the output device if the insulation fault locating unit is electrically connected to the power transmission network by means of the switch or is being connected even though the predefined condition is not or no longer fulfilled.

In addition, a locking device, in particular an electrically controlled locking device, is provided. The locking device is advantageously designed to lock the switch. The locking device is preferably designed to lock the switch and unlock it again. An electrical unlocking signal is preferably transmitted to the locking device if the predefined condition is fulfilled. The locking device then advantageously unlocks the switch.

An electrical locking signal is preferably transmitted to the locking device if the predefined condition is not or no longer fulfilled. The locking device then advantageously locks the switch.

In an advantageous embodiment of the invention, the switch is a manually operated switch. A person preferably actuates the switch if the predefined condition is fulfilled.

In another advantageous embodiment of the invention, the switch is a relay. To actuate the switch, at least one predefined electrical signal is preferably transmitted to the switch if the predefined condition is fulfilled.

Actuation of the switch advantageously causes the insulation fault locating unit to be electrically connected to the power transmission network.

In the case that the switch is a relay, a plurality of electrical signals are preferably transmitted to the switch to operate it. This enables a higher degree of protection against accidental actuation of the switch to be achieved. In particular, it can prevent the switch from being actuated if an individual signal is erroneously transmitted to the switch e.g. due to a technical defect.

The signals can be mutually independent signals relating e.g. to different states and/or variables of the device of which the power transmission system is a constituent part.

The power transmission system can be e.g. a constituent part of a vehicle, in particular of a rail vehicle. In this case the predefined condition can be dependent on a driving state, in particular of an instantaneous driving state, of the vehicle.

The driving state can relate, among other things, to a running speed of the vehicle. The predefined condition can include, for example, a zero running speed of the vehicle.

If the vehicle is a rail vehicle, the predefined condition can include the rail vehicle being parked in an activated state, a parking brake of the rail vehicle being applied and/or a maintenance mode being activated in a control unit of the rail vehicle.

"Parked in an activated state" can be understood as meaning that the rail vehicle is parked, i.e. the rail vehicle is stationary, and in addition its electrical energy supply is turned on. In addition, auxiliary systems such as e.g. a compressed air generating system may be active when the vehicle is parked in an activated state. A pantograph of the rail vehicle can be raised, i.e. be in electrical contact with an overhead line, when the vehicle is parked in the activated state.

The above description of advantageous embodiments contains numerous features which are in some cases grouped together in the individual sub-claims. However, these features can also advantageously be considered individually and amalgamated to produce other useful combinations. In particular, these features can be combined individually and in any suitable combination with the inventive power transmission system and the inventive method. Thus method features, concretely formulated, may also be regarded as characteristic of the corresponding device unit and vice versa. Even if some terms are used in the singular or in conjunction with a numeral in the description or in the claims, the scope of the invention shall not be limited to the singular or the respective numeral for these terms. Moreover, the words "a" or "an" are not to be understood as numerals but as indefinite articles.

The above described characteristics, features and advantages of the invention and the way in which they are achieved will become clearer and more readily comprehensible in conjunction with the following description of the exemplary embodiments which will be explained in greater detail with reference to the accompanying drawings. The exemplary embodiments serve to explain the invention and do not limit the invention to the combinations of features specified therein, nor in relation to the functional features. In addition, suitable features of each exemplary embodiment can also be explicitly considered in isolation, removed from the exemplary embodiment, incorporated in another exemplary embodiment for the supplementation thereof and combined with any of the claims.

BRIEF DESCRIPTION OF THE SEVERAL VIEWS OF THE DRAWING

FIG. 1 shows a rail vehicle having a power transmission system which comprises a power transmission network, an insulation fault locating unit and a relay which is designed to disconnect the insulation fault locating unit electrically from the power transmission network; and FIG. 2 shows another rail vehicle having a power transmission system which comprises a power transmission network, an insulation fault locating unit and a manually operated switch which is designed to disconnect the insulation fault locating unit electrically from the power transmission network.

DESCRIPTION OF THE INVENTION

FIG. 1 schematically illustrates a vehicle 2. In this case the vehicle 2 is a rail vehicle comprising four cars 4 which are coupled to one another. Two of these cars 4 are equipped with a pantograph 6.

The vehicle 2 has a power transmission system 8 comprising a power transmission network 10, a connecting line system 12, an insulation fault detection unit 14, and an insulation fault locating unit 16.

The power transmission network 12 additionally comprises a plurality of branch circuits 18, one of the branch circuits 18 being disposed in each of the cars 4. The branch circuits 18 are each electrically connected to an electrical load 20 of the respective car 4. Each of the branch circuits 18 also has a car branch cutout 22.

The two cars 4 with pantograph 6 each have a converter unit 24 which is electrically connected to the respective pantograph 6 and is designed to convert an AC voltage provided by the pantograph 6 into a DC voltage.

In addition, the power transmission network 10 is electrically connected to the two converter units 24 via an interposed decoupling diode 26 and main cutout 28.

The connecting line system 12 comprises a switch 30 which in this example is implemented as a relay, i.e. as an electrically controlled/operated switch. The switch 30 in turn comprises an actuating unit 32 for electrically or rather electromagnetically controlling a position of the switch 30. The switch 30 is also a changeover switch which is designed to electrically disconnect the insulation fault detection unit 14 from the power transmission network 10 and, in doing so, to electrically connect the insulation fault locating unit 16 to the power transmission network 10. The switch 30 is additionally designed to electrically disconnect the insulation fault locating unit 16 from the power transmission network 10 and, in doing so, to electrically connect the insulation fault detection unit 14 to the power transmission network 10.

In addition, the connecting line system 12 comprises a first connecting line 34 by which the switch 30 is electrically connected to the power transmission network 10. The connecting line system 12 also comprises a second connecting line 36 by which the insulation fault locating unit 16 is electrically connected to the switch 30, and a third connecting line 38 by which the insulation fault detection unit 14 is electrically connected to the switch 30.

The insulation fault locating unit 16 comprises an evaluation device 40 which is designed to generate a test current and pass it through the power transmission network 10. The insulation fault locating unit 16 further comprises a plurality of measuring instruments 42, in particular ammeters, and an equal number of instrument transformers 44, in particular current transformers.

One of the measuring instruments 42 and one of the instrument transformers 44 is disposed in each of the cars 4, wherein the instrument transformers 44 and measuring instruments 42 disposed in the same car 4 are electrically interconnected. In addition, the instrument transformers 44 are in each case connected to the branch circuit 18 of the power transmission network 10 which is disposed in the same car 4 as the respective instrument transformer 44.

One of the measuring instruments 42—in this exemplary embodiment the measuring instrument 42 disposed farthest right in the drawing—is connected to the evaluation device 40 of the insulation fault detection unit 16 via a separate data line 46. The other measuring instruments 42 are connected to the evaluation device 40 via a common data bus 48. In addition, each of the measuring instruments 42 is designed to transfer data to the evaluation device 40.

The power transmission system 8 also has a test device 50 which is designed to determine a position of the switch 30. In addition, the vehicle 2 is equipped with an output device 52 for outputting the switch position determined by means of the test device 50 and also with a train control unit 54.

In this exemplary embodiment, the evaluation device 40 of the insulation fault locating unit 16, the insulation fault detection unit 14, and the connecting line system 12 are not disposed in the same car 4 as the train control unit 54.

The insulation fault detection unit 14, the insulation fault locating unit 16, the test device 50, the actuating unit 32 of the switch 30, and the output device 52 are connected to the train control unit 54 via a separate data line in each case. In principle, the test device 50 could alternatively be directly connected to the output device 52 via a data line.

During running of the vehicle 2—as shown in FIG. 1—the insulation fault detection unit 14 is electrically connected to the power transmission network 10 by means of the switch 30 and the insulation fault locating unit 16 is electrically disconnected from the power transmission network 10 by means of the switch 30.

During vehicle movement, the insulation fault detection unit 14 is used to determine whether the power transmission system 8, in particular any of the branch circuits 18 of the power transmission system 8, has an insulation fault.

Specifically, the insulation fault detection unit 14 is used to determine whether the power transmission system 8 has a ground fault. For this purpose the insulation fault detection unit 14 monitors an insulation resistance of the power transmission network 10, in particular an insulation resistance with respect to ground potential.

If the insulation fault detection unit 14 determines that the power transmission system 8 has an insulation fault, the insulation fault detection unit 14 generates an appropriate indication for the train control unit 54 and transmits this indication to the train control unit 54. The train control unit 54 generates a digital time stamp for the indication and stores it together with the indication. This means that during subsequent maintenance or diagnostic work on the vehicle 2 it is possible to ascertain when the insulation fault occurred.

To locate the insulation fault using the insulation fault locating unit 16, the vehicle 2 is parked.

If a predefined condition is fulfilled, the insulation fault locating unit 16 previously electrically disconnected from the power transmission network 10 by means of the switch 30 is electrically connected to the power transmission network 10 by means of the switch 30. At the same time, the insulation fault detection unit 14 previously electrically connected to the power transmission network 10 by means of the switch 30 is electrically disconnected from the power transmission network 10 by means of the switch 30.

is In this case the predefined condition includes the vehicle 2 being parked in the activated state, a parking brake of the vehicle 2 being applied and a maintenance mode being activated in the train control unit 54.

To ensure that the switch 30 implemented as a relay changes its position in the manner described, three mutually independent electrical signals are continuously transmitted by the train control unit 54 to the switch 30, in particular to the actuating unit 32 of the switch 30. A first of the three signals provides information that the vehicle 2 is parked in the activated state. A second of the three signals provides information that a parking brake of the vehicle 2 is applied, and a third of the three signals provides information that maintenance mode is activated in the train control unit 54.

In addition, a position of the switch 30 is continuously determined by means of the test device 50 and the switch position determined is transmitted to the train control unit 54. The train control unit 54 in turn transmits it to the output device 52 which visually outputs the switch position.

The insulation fault locating unit 16 generates a test current which is dependent, among other things, on a voltage provided by the power transmission network 10, and on an insulation resistance of the power transmission network 10 determined by the insulation fault detection unit 14.

The test current is passed through the individual branch circuits 18 of the power transmission network 10. In addition, each of the instrument transformers 44 produces a test-current-dependent electrical measurement signal which is transmitted to the measuring instrument 42 electrically connected to the respective instrument transformer 44.

In addition, a measured variable dependent on the test current is determined by each of the measuring instruments 42 using the respective measurement signal and transmitted to the evaluation device 40 together with a unique identifier of the measuring instrument 42.

Using the measured variables transmitted by the measuring instruments 42, the evaluation device 40 determines which of the branch circuits 18 has the insulation fault. The unique identifiers of the measuring instruments 42 are used to identify the branch circuit 18 having the insulation fault.

The evaluation device 40 also generates for the train control unit 54 an indication containing information as to which of the branch circuits 18 has the insulation fault, and transmits this indication to the train control unit 54. The train control unit 54 in turn forwards this indication to the output device 52 which visually outputs the indication.

If the predefined condition is no longer fulfilled, i.e. one of the three above mentioned electrical signals decays or drops out, the insulation fault locating unit 16 is electrically disconnected from the power transmission network 10 and the insulation fault detection unit 14 is electrically connected to the power transmission network 10 by means of the switch 30.

The following description is essentially limited to the differences compared to the previous exemplary embodiment to which reference should be made in respect of features and functions that remain the same. Identical or mutually corresponding elements are basically always denoted by the same reference characters and features not mentioned are adopted in the following exemplary embodiment without being described again.

FIG. 2 schematically illustrates another vehicle 2. In this case the vehicle 2 is again a rail vehicle.

The vehicle 2 has a power transmission system 8 comprising a power transmission network 10, a connecting line system 12, an insulation fault detection unit 14, and an insulation fault locating unit 16.

The connecting line system 12 comprises a switch 30 which in this exemplary embodiment is implemented as a manually operated switch, in particular as a rotary switch. The switch 30 is a changeover switch which is designed to electrically disconnect the insulation fault detection unit 14 from the power transmission network 10 and, in doing so, to electrically connect the insulation fault locating unit 16 to the power transmission network 10. In addition, the switch 30 is designed to electrically disconnect the insulation fault locating unit 16 from the power transmission network 10 and, in doing so, to electrically connect the insulation fault locating unit 14 to the power transmission network 10.

The power transmission system 8 also has a test device 50 which is designed to detect a position of the switch 30. The vehicle 2 is additionally equipped with an output device 52 for outputting the switch position determined by means of the test device 50, and also with a train control unit 54.

In addition, the power transmission system 8 comprises an electrically controllable locking device 56 which is connected to the train control unit 54 via a data line. The locking device 56 is designed to mechanically lock the switch 30 and unlock it again. The vehicle 2 from FIG. 1 could in principle also have such a locking device 56 as an additional safety measure.

In this exemplary embodiment, the evaluation device 40 of the insulation fault locating unit 16, the insulation fault detection unit 14, and the connecting line system 12 are disposed in the same car 4 as the train control unit 54.

During running of the vehicle 2—as shown in FIG. 2—the insulation fault detection unit 14 is electrically connected to the power transmission network 10 by means of the switch 30 and the insulation fault locating unit 16 is electrically disconnected from the power transmission network 10 by means of the switch 30. The switch 30 is also locked by means of the locking device 56.

To locate the insulation fault by means of the insulation fault locating unit 16, the vehicle 2 is parked.

If a predefined condition is fulfilled, a member of the technical staff transmits an electrical unlocking signal to the locking device 56 by means of the train control unit 56 in order to unlock the switch 30. The locking device 56 thereupon unlocks the switch 30.

The predefined condition includes the vehicle 2 being parked in the activated state, a parking brake of the vehicle 2 being applied and a maintenance mode being activated in the train control unit 54.

In addition, the insulation fault locating unit 16 previously electrically disconnected from the power transmission network 10 by means of the switch 30 is electrically connected to the power transmission network 10 by means of the switch 30, the switch 30 being manually actuated by said person. At the same time the insulation fault detection unit 14 previously electrically connected to the power transmission network 10 by means of the switch 30 is electrically disconnected from the power transmission network 10 by means of the switch 30.

If the predefined condition is no longer fulfilled, the insulation fault locating unit 16 is electrically disconnected from the power transmission network 10 by means of the switch 30 and the insulation fault detection unit 14 is electrically connected to the power transmission network 10. For this purpose the switch is actuated accordingly by the person. In addition, the person transmits an electrical locking signal to the locking device 56 by means of the train control unit 54 if the predefined condition is no longer fulfilled. Thereupon the locking device 56 unlocks the switch 30.

Although the invention has been illustrated and described in detail by the preferred exemplary embodiments, the invention is not limited by the examples disclosed and other variations may be inferred therefrom by persons skilled in the art without departing from the scope of protection sought for the invention.

The invention claimed is:

1. A power transmission system, comprising:
   a power transmission network;
   an insulation fault detection unit;

an insulation fault locating unit; and a connecting line system electrically connected to said power transmission network, said connecting line system including a changeover switch constructed to break an electrical connection between said insulation fault detection unit and said power transmission network and, simultaneously, to electrically connect said insulation fault locating unit to the power transmission network.

2. The power transmission system according to claim 1, wherein said switch is a manually operated switch or rotary switch or a relay.

3. The power transmission system according to claim 1, which further comprises at least one of an electrically controllable locking device constructed to lock and unlock said switch or a test device for determining a position of said switch.

4. A vehicle or rail vehicle, comprising a power transmission system according to claim 1.

5. The power transmission system according to claim 1, wherein said changeover switch is a single-pole double-throw switch with said power transmission network connected to said single-pole.

6. A power transmission system, comprising:
   a power transmission network;
   an insulation fault locating unit;
   a connecting line system being electrically connected to said insulation fault locating unit and to said power transmission network, said connecting line system including a switch constructed to break and re-establish an electrical connection between said power transmission network and said insulation fault locating unit;
   a data bus;
   said power transmission network including a plurality of branch circuits;
   said insulation fault locating unit including an evaluation device, a plurality of measuring instruments each being associated with a respective one of said branch circuits and a plurality of instrument transformers each being electrically connected to a respective one of said measuring instruments;
   said instrument transformers each being disposed on a respective one of said branch circuits; and
   a plurality of said measuring instruments being connected to said evaluation device by said data bus.

7. The power transmission system according to claim 6, wherein said measuring instruments are ammeters, and said instrument transformers are current transformers.

8. A method for operating a power transmission system, the method comprising the following steps:
   selectively electrically connecting a connecting line system between a power transmission network and an insulation fault detection unit or an insulation fault locating unit via a changeover switch ; and
   upon occurrence of a predefined condition, using the changeover switch of the connecting line system to break an electrical connection between the insulation fault detection unit and the power transmission network and, simultaneously, to electrically connect the insulation fault locating unit to the power transmission network.

9. The method according to claim 8, wherein the predefined condition is a condition of a device, of which the power transmission system is a constituent part, in a predefined state.

10. The method according to claim 8, which further comprises determining a position of the switch, and at least one of visually or audibly outputting the switch position.

11. The method according to claim 8, which further comprises:
   providing an electrically controllable locking device constructed to lock and unlock the switch; and
   using the locking device to unlock the switch, upon fulfilling the predefined condition, by transmitting an electrical unlocking signal to the electrically controllable locking device.

12. The method according to claim 8, wherein the switch is a manually operated switch being manually operated by a person upon fulfilling the predefined condition.

13. The method according to claim 8, wherein the switch is a relay, and at least one predefined electrical signal is transmitted to the switch to actuate the switch upon fulfilling the predefined condition.

14. The method according to claim 8, wherein the power transmission system is a constituent part of a vehicle or rail vehicle.

15. The method according to claim 8, wherein said changeover switch is a single-pole, double-throw switch with said power transmission network connected to said single-pole.

* * * * *